(12) United States Patent
Malinin et al.

(10) Patent No.: US 10,516,340 B1
(45) Date of Patent: Dec. 24, 2019

(54) COMMUNICATION THROUGH THE FLYBACK POWER TRANSFORMER BY THE USAGE OF THE ZERO VOLTAGE SWITCHING PULSE

(71) Applicant: Infineon Technologies Austria AG, Villach (AT)

(72) Inventors: Andrey Malinin, Fort Collins, CO (US); Renato Bessegato, Oberhaching (DE)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 16/160,837

(22) Filed: Oct. 15, 2018

(51) Int. Cl.
*H02M 3/335* (2006.01)
*H02M 1/08* (2006.01)
*H03M 5/12* (2006.01)

(52) U.S. Cl.
CPC ....... *H02M 3/33592* (2013.01); *H02M 1/083* (2013.01); *H03M 5/12* (2013.01)

(58) Field of Classification Search
CPC ......... H02M 3/33515; H02M 3/33507; H02M 1/83; H02M 5/12
USPC ................... 363/21.08, 21.012, 21.15–21.18
See application file for complete search history.

(56) References Cited

U.S. PATENT DOCUMENTS

| | | | | |
|---|---|---|---|---|
| 6,198,230 B1* | 3/2001 | Leeb | .................. | H04B 10/1143 315/200 R |
| 6,496,059 B1* | 12/2002 | Nguyen | ................ | H03F 3/2173 330/10 |
| 6,912,139 B2* | 6/2005 | Kernahan | .......... | H03K 19/0963 363/41 |
| 7,046,064 B1* | 5/2006 | Runaldue | .................. | H03L 7/06 327/237 |
| 8,194,424 B2* | 6/2012 | Stanley | .................... | H02M 7/48 323/235 |
| 9,602,015 B2 | 3/2017 | Mednik et al. | | |
| 2014/0098578 A1* | 4/2014 | Halberstadt | ....... | H02M 3/33515 363/21.15 |
| 2016/0056703 A1 | 2/2016 | Deboy et al. | | |
| 2016/0056704 A1 | 2/2016 | Deboy | | |

(Continued)

OTHER PUBLICATIONS

"Highly Integrated AC/DC Primary-Side Rapid Charge PWM Controller Supporting XM-Comm Technology," Dialog Semiconductor iW1790, Rev. 1.2, Apr. 2018, 7 pp.

(Continued)

*Primary Examiner* — Rajnikant B Patel
(74) *Attorney, Agent, or Firm* — Shumaker & Sieffert, P.A.

(57) ABSTRACT

The disclosure describes techniques to send digital information from the secondary side to the primary side of a power converter, such as a flyback power converter. By modulating the amount of time between zero voltage switching (ZVS) pulses initiated by a synchronous rectification (SR) transistor on the secondary side, a power converter circuit of this disclosure may communicate digital information to the primary side from the secondary side. The power converter circuit of this disclosure may include stable, accurate and reliable ZVS pulse detection techniques on the primary side to determine slight changes in the period between ZVS pulses from the secondary side. A controller circuit on the secondary side may encode digital information by modulating the ZVS period, e.g. increased period, decreased period or no change to the period.

20 Claims, 7 Drawing Sheets

(56) References Cited

U.S. PATENT DOCUMENTS

2017/0133929 A1* 5/2017 Matsuki .................. H02M 1/08
2017/0244332 A1* 8/2017 Leong ............... H02M 3/33523
2017/0250612 A1* 8/2017 Malinin ............ H02M 3/33507

OTHER PUBLICATIONS

"Off-Line CV/CC Flyback Switcher IC with Integrated 725 V/ 900 V MOSFET, Sync-Rect Feedback with Advanced Protection," Power Integrations, Sep. 2017, 34 pp.

"Differential Manchester encoding," accessed on Sep. 11, 2018, accessed from https://ipfs.io/ipfs/QmXoypizjW3WknFiJnKLwHCnL72vedxjQkDDP1mXWo6uco/wiki/Differential_Manchester_encoding.html, 4 pp.

"Introduction to Digital Filters," accessed on Sep. 11, 2018, accessed from http://123.physics.ucdavis.edu/week_5_files/filters/digital_filter.pdf, 15 pp.

"Planar Versus Conventional Transformer," Pulse Electronics, accessed on Sep. 11, 2018, accessed from http://www.power.pulseelectronics.com/hubfs/Transformers/Pulse-Power-BU-Planar-vs-Conventional-Transformer.pdf, 5 pp.

"ECE Tutorials," accessed on Aug. 29, 2018, accessed from http://ecetutorials.com/electrical/snubber-circuits-for-power-electronics/, 4 pp.

"Sequential Logic Circuits," accessed on Sep. 30, 2018, accessed from https://www.electronics-tutorials.ws/sequential/seq_1.html, 12 pp.

Lee, "Chapter 14 Transformers," ISU EE Slide Presentation, accessed on Sep. 10, 2018, 26 pp.

Severns, "Design of Snubbers for Power Circuits," accessed on Aug. 29, 2018, accessed from http://www.cde.com/resources/technical-papers/design.pdf, 29 pp.

Mishima, et al., "A High Frequency Planar Transformer-linked ZVS DC-DC Converter with Secondary-side Phase-Shifting PWM Rectifier" 2009 13th European Conference, Sep. 2009, 9 pp.

* cited by examiner

COMMUNICATION THROUGH THE FLYBACK POWER TRANSFORMER BY THE USAGE OF THE ZERO VOLTAGE SWITCHING PULSE

TECHNICAL FIELD

The disclosure relates to power converters.

BACKGROUND

In isolated power converters it may be desirable to communicate signals from the secondary side to the primary side. Some types of communication may include synchronizing primary and secondary switch timing and communicating changes in load power demand. Some example techniques to communicate between the secondary and primary include a separate communication channel, which may require isolation, such as an optoisolator. Other examples may require additional components to modulate existing signals already occurring in the power converter, such as modulating a ringing frequency.

SUMMARY

In general, the disclosure is directed to techniques to send digital information from the secondary side to the primary side of a power converter, such as a flyback power converter. By modulating the amount of time between zero voltage switching (ZVS) pulses initiated by a synchronous rectification (SR) transistor on the secondary side, a power converter circuit of this disclosure may communicate digital information to the primary side from the secondary side. The power converter circuit of this disclosure may include stable, accurate and reliable ZVS pulse detection techniques on the primary side to determine slight changes in the period between ZVS pulses from the secondary side. A controller circuit on the secondary side may encode digital information by modulating the ZVS period, e.g. increased period, decreased period or no change to the period.

In one example, the disclosure is directed to a system comprising: A system comprising: an isolated power converter comprising a power transformer, a secondary side controller configured to: control a synchronous rectification (SR) switch of the power converter, wherein the secondary side controller is configured to initiate zero voltage switching (ZVS) by controlling a switching time of the SR switch and encode digital information by modulating a period between the switching time of the SR switch. The system further comprises a primary side controller configured to: control a primary side switch of the power converter, detect the switching time of the SR switch, and decode the digital information based on the modulated period between the switching time of the SR switch.

In another example, the disclosure is directed to a device comprising: a zero voltage switching (ZVS) detection circuit configured to detect a ZVS pulse, a timer circuit operatively coupled to the ZVS circuit, the timer circuit configured to: determine a first time period between a first ZVS pulse and a second ZVS pulse, and determine a second time period between a third ZVS pulse and a fourth ZVS pulse, and a decoder circuit operatively coupled to the timer circuit, the decoder circuit configured to decode digital information based on the first time period and the second time period.

In another example, the disclosure is directed to a method comprising: detecting, by a controller circuit, a plurality of zero voltage switching (ZVS) pulses, wherein the plurality of ZVS pulses comprise a first ZVS pulse, a second ZVS pulse, a third ZVS pulse and a fourth ZVS pulse, determining, by the controller circuit, a first time period between the first ZVS pulse and the second ZVS pulse, determining, by the controller circuit, a second time period between the third ZVS pulse and the fourth ZVS pulse and decoding, by the controller circuit, digital information based on the first time period and the second time period.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
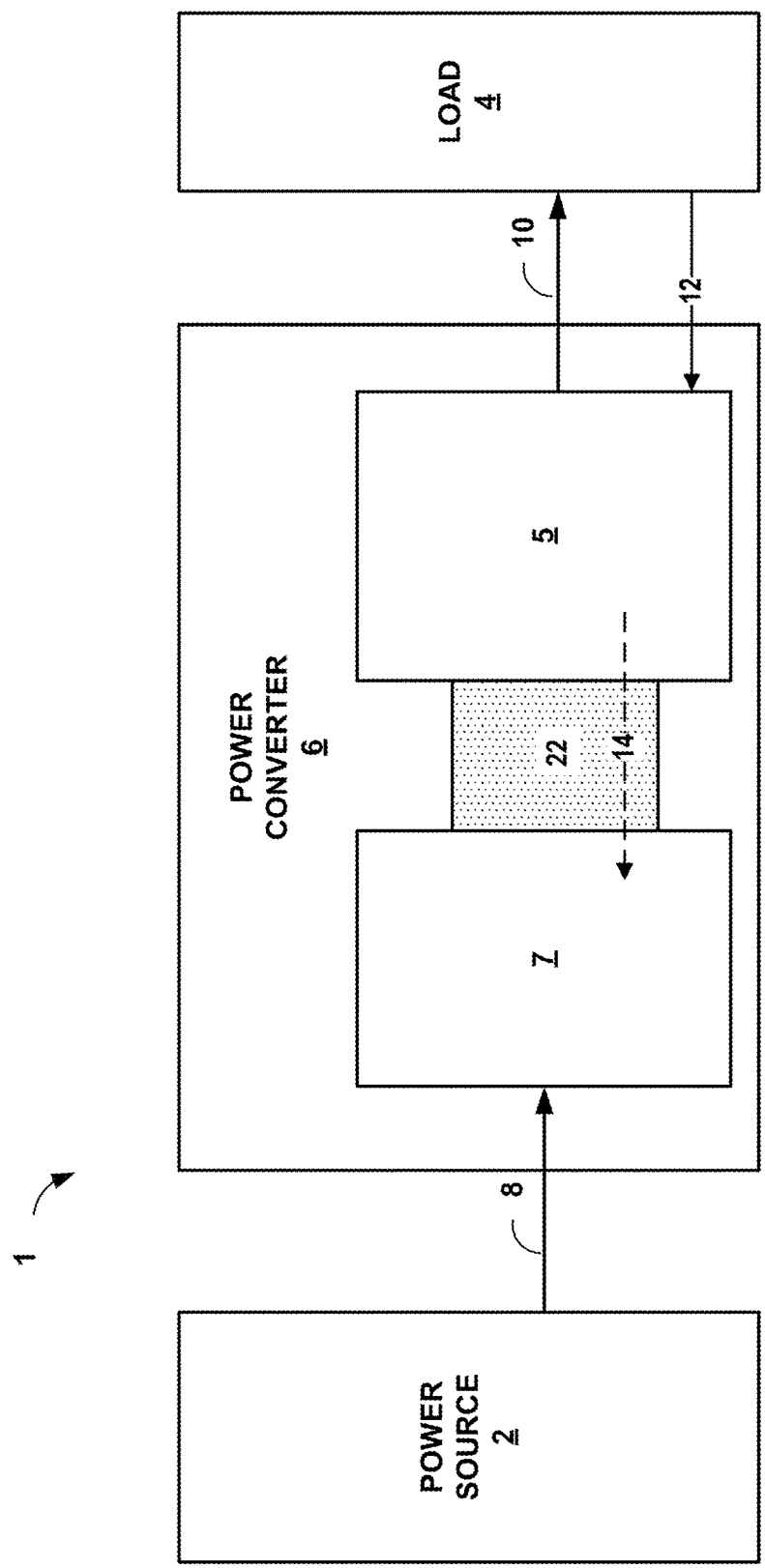
FIG. 1 is a block diagram illustrating an example system for converting power from a power source and configured to communicate across a power transformer, in accordance with one or more aspects of the present disclosure.

In general, the disclosure is directed to techniques to send digital information from the secondary side to primary side of a power converter, such as a flyback power converter. By modulating the amount of time between the edges of zero voltage switching (ZVS) pulses initiated by a synchronous rectification (SR) transistor on the secondary side, a power converter circuit of this disclosure may communicate digital information to the primary side from the secondary side. The power converter circuit of this disclosure may include stable, accurate and reliable ZVS pulse detection techniques on the primary side to determine slight changes in the period between ZVS pulses from the secondary side. A controller circuit on the secondary side may encode digital information by modulating the ZVS period, e.g. increased period, decreased period or no change to the period.

The techniques of this disclosure take advantage of components and signals that are already used by a power converter circuit. In contrast with other techniques used to communicate between the secondary and primary side of an isolated power converter, the techniques of this disclosure do not require a separate communication channel, such as a communication channel using an opto-isolator or a lead frame-based coreless transformer. Techniques that use an additional communication device may have added cost and add complexity to the power supply design.

Some other example techniques do not require additional media and will re-use components which are already part of the power converter, such as a power transformer and SR switch. For example, some techniques rely on extending the free ringing of a discontinuous conduction mode (DCM) flyback power converter. Digital information, i.e. zeros and ones, are encoded by the extending first or second ringing after the primary side switching cycle. However, this ringing extension technique has two deficiencies. The first is that this technique relies on a variable switching frequency, which means this technique is incompatible with the fixed frequency control systems. Second, the ringing extension technique does not support ZVS, which may be a desirable feature, such as for power converters that use planar transformers.

Other example techniques use one or more additional switches, which connects an additional capacitor parallel to the output rectifier. These additional components essentially modulate the free ringing frequency of the flyback. However, this technique requires an additional switch and a capacitor with added cost, increased footprint and increased complexity.

In contrast, the techniques of this disclosure communicate through the transformer but retain galvanic isolation between the primary side and secondary side, and require no additional communication device or channel, nor additional components beyond those components already part of the power converter. Also, unlike other communication methods that communicate across the power transformer, the techniques of this disclosure support ZVS and constant frequency modes and support both DCM and continuous conduction mode (CCM) as well as a variety of primary side control techniques such peak current control or time-based pulse width modulation (PWM).

FIG. 1 is a block diagram illustrating an example system for converting power from a power source and configured to communicate across a power transformer, in accordance with one or more aspects of the present disclosure. FIG. 1 shows system 1 as having four separate and distinct components shown as power source 2, power converter 6, and load 4, however system 1 may include additional or fewer components. For instance, power source 2, power converter 6, and load 4 may be four individual components or may represent a combination of one or more components that provide the functionality of system 1 as described herein.

System 1 includes power source 2 which provides electrical power to system 1. Power source 2 may be an alternating current (AC) or direct current (DC) power source. Numerous examples of power source 2 exist and may include, but are not limited to, power grids, generators, transformers, batteries, solar panels, windmills, regenerative braking systems, hydro-electrical or wind-powered generators, or any other form of devices that are capable of providing electrical power to system 1.

System 1 includes power converter 6 which operates as a flyback power converter that converts one form of electrical power provided by power source 2 into a different, and usable form of electrical power for powering load 4. Power converter 6 is shown having primary side 7 separated by transformer 22 from secondary side 5. In some examples, transformer 22 may include more than one transformer or sets of transformer windings configured to transfer energy from source 2 to load 4. Using transformer 22 and the components of primary side 7 and secondary side 5, power converter 6 can convert the power input at link 8 into a power output at link 10. A flyback power converter is a type of isolated power converter.

Load 4 (also sometimes referred to herein as device 4) receives the electrical power converted by power converter 6. In some examples, load 4 may use electrical power from power converter 6 to perform a function.

Power source 2 may provide electrical power with a first voltage level and current level over link 8. Load 4 may receive electrical power that has a second voltage and current level, converted by power converter 6 over link 10. Links 8 and 10 represent any medium capable of conducting electrical power from one location to another. Examples of links 8 and 10 include, but are not limited to, physical and/or wireless electrical transmission mediums such as electrical wires, electrical traces, conductive gas tubes, twisted wire pairs, and the like. Each of links 8 and 10 provide electrical coupling between, respectively, power source 2 and power converter 6, and power converter 6 and load 4.

In the example of system 1, electrical power delivered by power source 2 can be converted by converter 6 to power that has a regulated voltage and/or current level that meets the power requirements of load 4. For instance, power source 2 may output, and power converter 6 may receive, power which has a first voltage level at link 8. Power converter 6 may convert the power which has the first voltage level to power which has a second voltage level that is required by load 4. Power converter 6 may output the power that has the second voltage level at link 10. Load 4 may receive the converted power that has the second voltage level at link 10 and load 4 may use the converted power having the second voltage level to perform a function (e.g., power a microprocessor, charge a battery, etc.). In some examples the second voltage level may by greater than, less than or approximately the same as the first voltage level.

In operation, as described in more detail below with respect to the additional figures, power converter 6 may control the level of current and voltage at link 10 by exchanging information between secondary side 5 and primary side 7, via transformer 22, which is depicted by communication link 14. Communication link 14 is not a dedicated communication link. Instead, as described herein, converter 6 is configured to pass information, from secondary side 5, via transformer 22, to primary side 7. In other words, rather than include an additional, electrically isolated communication link, which may be used by other flyback converters to transfer information between two sides of a flyback, converter 6 is configured to control the switching time of an SR switch on the secondary side 5. Secondary side 5 may encode digital information by modulating a period between the switching time of the SR switch as a way to send information from secondary side 5 to primary side 7. In some examples, secondary side 5 may receive digital information from load 4, or other sources, via communication link 12.

Primary side 7 may detect changes in the period between the switching time of the SR switch via transformer 22. Primary side 7 may decode the digital information based on the modulated period between the switching time of the SR switch. Some examples of digital information transferred between for example, to communicate to primary side 7, that load 4 requires additional energy from source 2, to communicate temperature and other operating parameters of load 4, or any other information that may be digitally encoded.

Figure 2:
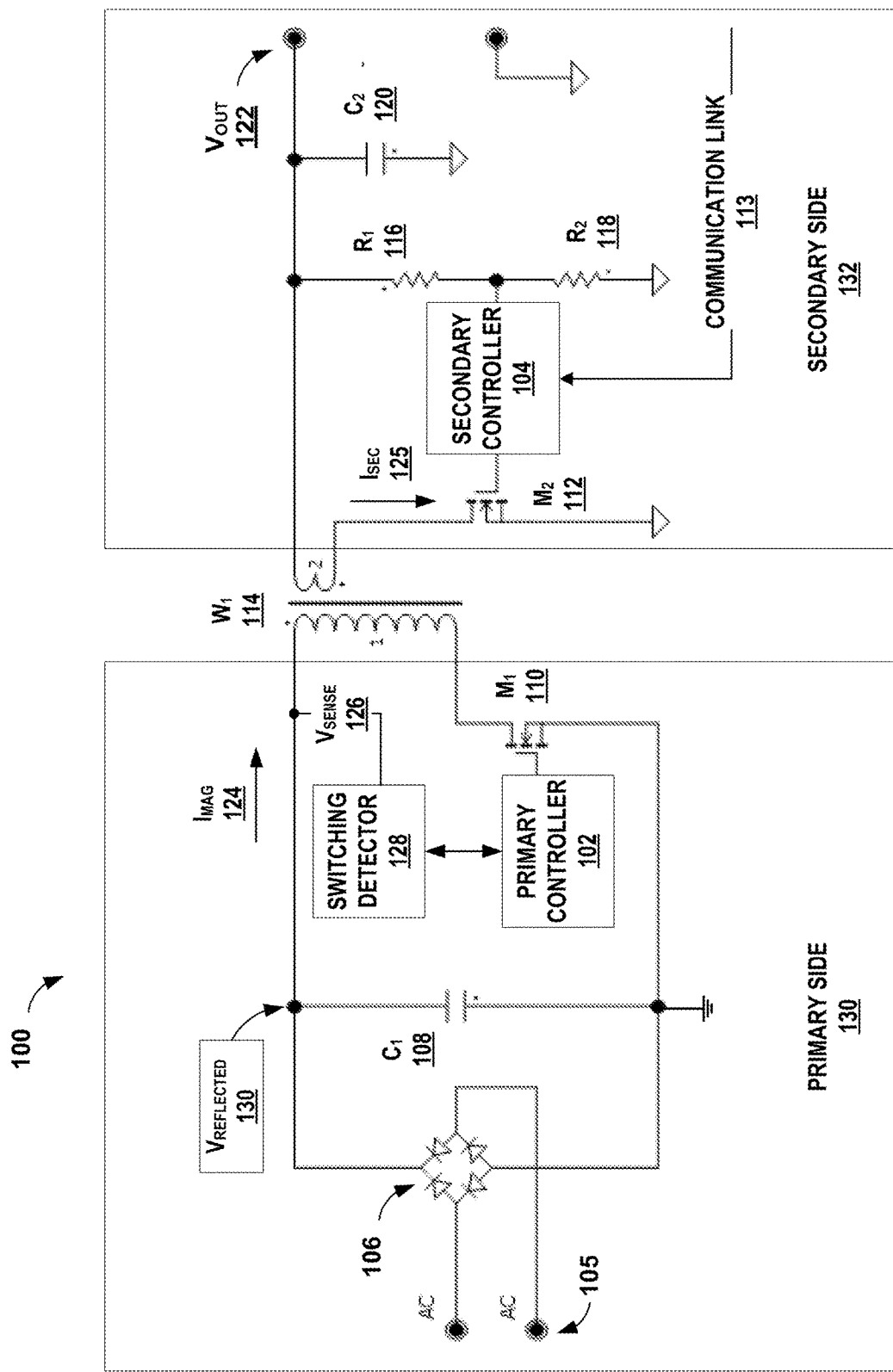
FIG. 2 is a schematic diagram illustrating an example power converter circuit according to one or more techniques of this disclosure.

FIG. 2 is a schematic diagram illustrating an example power converter circuit according to one or more techniques of this disclosure. Power converter 100 of FIG. 2 includes a transformer, W1 114, primary side 130 and secondary side 132, similar to system 1 described above in relation to FIG. 1. For communication of digital data, this disclosure describes techniques that use the falling edge of an SR switch initiated ZVS pulse to send digital information from secondary side 132 to primary side 130 of power converter 100. Some example of such information may include, current limit, digitized temperature information, output voltage set-point, i.e. the target voltage, such as 5V, 9V, 3V and so on.

Primary side 130 includes diode rectifier 106, capacitor C1 108, Pulse detector 128, primary controller 102 and primary side switch M1 110. Rectifier 106 receives AC power from AC input terminals 105 and connects to primary side capacitor C1 108. Primary controller 102 controls the gate of primary side switch M1 110. Primary side switch connects one terminal of the primary winding of transformer W1 114 to a primary side ground node. Pulse detector 128 monitors the reflected voltage $V_{REFLECTED}$ 130 through a voltage sensing input $V_{SENSE}$ 126. Reflected voltage $V_{REFLECTED}$ 130, in the example of FIG. 2 is the output voltage $V_{OUT}$ 122 as scaled by the turns ratio of the transformer. A load across the secondary winding of a transformer appears to the primary side 130 as a reflected load having a value dependent on the reciprocal of the turns ratio squared. Similarly, magnetizing current in the primary winding is reflected in the secondary winding and scaled by the turns ratio.

In the example of FIG. 2, primary side switch M1 110 is shown as a metal oxide semiconductor field effect transistor (MOSFET), but in other examples, primary side switch M1 110 may be implemented as a different type of switch, such as an insulated gate bipolar transistor (IGBT). In other examples, primary side 130 may be configured to receive DC power input and may not include rectifier 106.

Secondary side 132 includes SR switch M2 112, secondary controller 104, a resistor divider that includes R1 116 and R2 118, and output capacitor C2 120. A first terminal of the secondary side of transformer W1 114 connects to the output terminal, $V_{OUT}$ 122 as well as to one terminal of resistor R1 116. The opposite terminal of resistor R1 116 connects to secondary controller 104. Resistor R2 118 connects secondary controller 104 and the opposite terminal of resistor R1 116 to the secondary side ground. Secondary controller 104 monitors output voltage $V_{OUT}$ 122 through the resistor divider formed by resistors R1 116 and R2 118. Output capacitor C2 120 connects Vout 122 to the secondary side ground. In some examples, the secondary side ground may be different from the primary side ground.

Transformer W1 114 isolates primary side 130 or power converter 100 from secondary side 132 as well as steps up or steps down the secondary side voltage based on the turns ratio between the primary winding and the secondary winding. In some examples, transformer W1 114 may also include one or more auxiliary windings (not shown in FIG. 2).

In a synchronous power converter, such as power converter 100, secondary side rectification is performed by an SR switch, such as SR switch M2 112. Synchronous rectification may also be called active rectification and may have advantages over the use of diode rectification on the secondary side of a power converter in some applications. secondary controller 104 may drive the gate pin of the SR switch M2 112 as needed to rectify the signal from the secondary side of transformer W1 114. In other words, secondary controller 104 causes SR switch M2 112 to act as a rectifier and actively turn on to allow current in one direction but actively turn off to block current from flowing the other direction, i.e. to act as an ideal diode. In some examples secondary controller 104 may be considered a SR controller.

Both primary side switch M1 110 and SR switch M2 112 are driven in a complimentary manner. The techniques of this disclosure apply to power converters operating in either continuous conduction mode (CCM) or discontinuous conduction mode (DCM). In examples in which SR switch M2 112 is a FET and when SR switch M2 112 is off, current from the secondary winding, Isec 125, may flow through the body diode of SR switch M2 112. A body diode for a FET may have a larger voltage drop than the source-to-drain voltage when the FET is turned ON. To improve the system efficiency, SR switch M2 112 may be turned ON prior to the next switching cycle for a pre-defined period of time to allow secondary side current Isec 125 to flow with a reduced voltage drop. During the time SR switch M2 112 is turned on, some energy from output capacitor C2 120 is stored in the transformer magnetizing inductance. When SR switch M2 112 is turned OFF, the resulting magnetizing current, Imag 124 recharges the primary side parasitic capacitance, which causes primary switch M1 110 to turn ON when detecting zero voltage as measured at $V_{SENSE}$ 126. The primary side parasitic capacitance may include parasitic capacitance of the transformer, as well as parasitic drain-source capacitance (Cds) of primary switch M1 110. In other words, primary side controller 102 detects the ZVS event and initiates a switching cycle. Falling edge of a ZVS pulse at primary side 130 is consistently aligned with SR switch M2 112 turn off at secondary side 132 and can be very reliably detected by Pulse detector 128 in communication with primary side controller 102. Controlling the primary side switch M1 110 to switch ON when detecting zero volts is called ZVS operation.

For communication operation, secondary controller 104 may receive digital information to be sent from secondary side 132 to primary side 130. In some examples, secondary controller 104 may receive the information via communication link 113. Communication link 113 may be implemented by signal wires, wireless link, load modulation, and similar communication techniques. Communication link 113 may carry information, including digital information, from a load, similar to communication link 12 and load 4 as described above in relation to FIG. 1. Secondary controller 104 may also receive information to encode from sources other than the load, such as temperature sensors, a processor (e.g. a microcontroller), or other sources. Secondary controller 104 may encode the received information into digital information by modulating a period between the switching time of the SR switch.

Secondary controller 104 may use a variety of coding schemes to encode the received information into digital information. In some examples, secondary controller 104 may encode the digital information based on a differential coding scheme with at least three modulation states such as a reduced time period, an increased time period and no modulation, i.e. no change in time period. In other examples, secondary controller 104 may encode the information based on a differential coding scheme with more than three levels. In other examples, secondary controller 104 may encode a digital one into the reduced period and digital zeros into the extended period, or vice versa. A differential coding scheme may have some advantages over other coding schemes because a differential coding scheme may require less precise synchronization of the primary and secondary timers. For example, a coding scheme based on a Manchester code, which is based on the difference between two cycles may not need precise synchronization. A Manchester code needs at least two switching cycles to send one bit of the information, so a Manchester code may be slower than other coding schemes. For example, Manchester encoding zero may be represented as +/−/+, or −/+/−, with the last transition is first switching cycle of the next bit. Similarly, a digital one may be represented as +/+/− or −/−/+. Manchester encoding may have difficulty to detect and manage the start bit synchronization and resynchronization after lost bit, which may result in difficulty with error correction.

On the primary side 130, pulse detector 128 may detect the ZVS pulse in the reflected voltage, $V_{REFLECTED}$ 130 sensed on the primary winding of power transformer W1 114. Pulse detector 128 may detect and measure the small changes in time period, e.g. reduced time period and extended time period, and decode the digital information encoded by secondary controller 104. In other words, pulse detector 128 may detect the switching time of the SR switch and decode the digital information based on the modulated period between the switching time of the SR switch. Though pulse detector 128 is depicted as a block separate from primary controller 102, in some examples pulse detector 128 may be included within primary controller 102. In some examples, pulse detector 128 may sense a different voltage than $V_{REFLECTED}$ 130, such as the drain-source voltage of primary side switch M1 110 or a voltage across an auxiliary winding of transformer W1 114.

Figure 3:
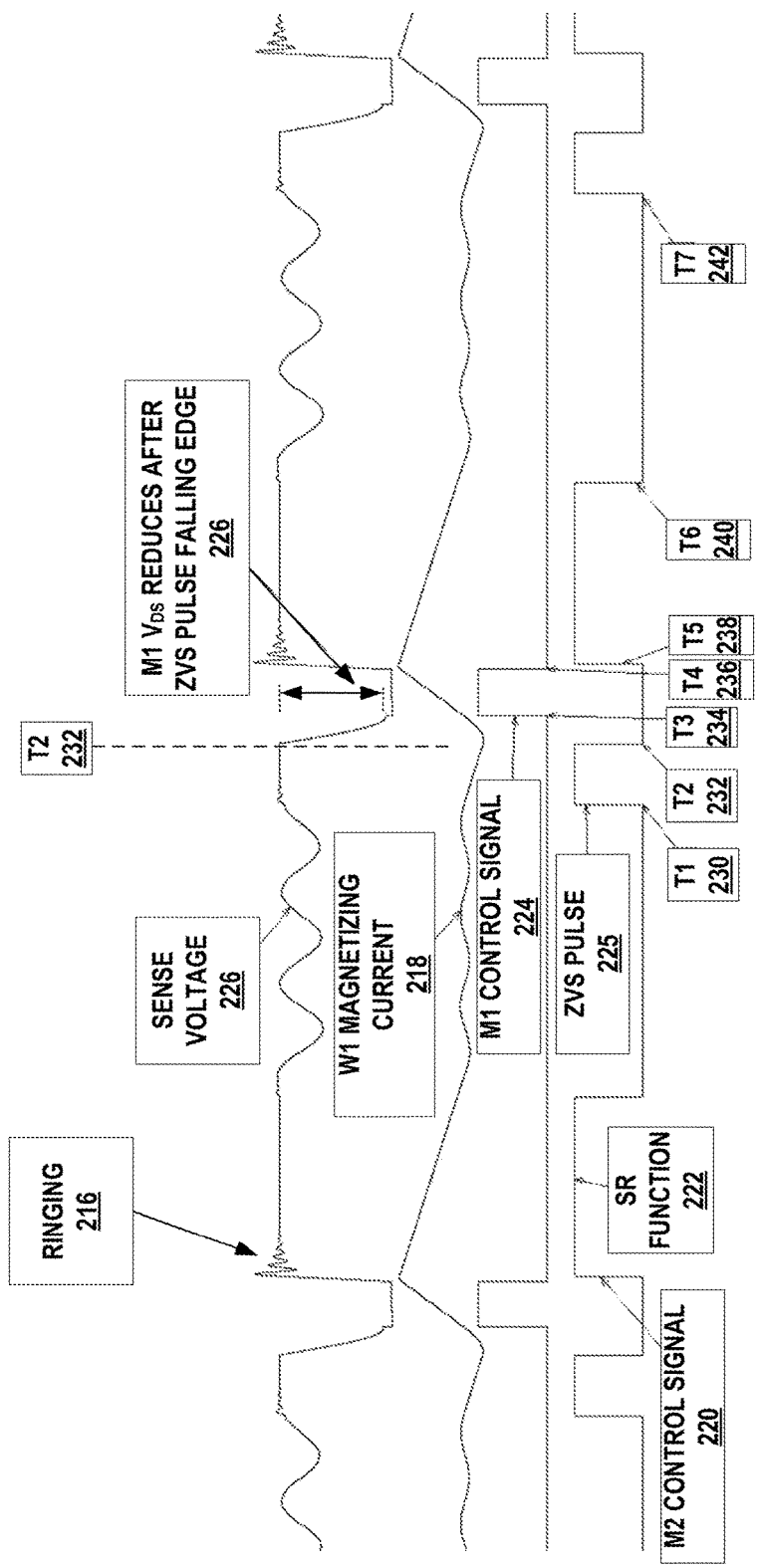
FIG. 3 is a timing diagram illustrating an example operation of a power converter circuit that includes a ZVS pulse detection circuit, according to one or more techniques of this disclosure.

FIG. 3 is a timing diagram illustrating an example operation of a power converter circuit that includes a ZVS pulse detection circuit, according to one or more techniques of this disclosure. The example of FIG. 3 depicts an example of a switching cycle of a flyback power converter, similar to power converter 100 described above in relation to FIG. 2. The description of the timing diagram of FIG. 3 may refer to components in The timing diagram of FIG. 3 depicts sense voltage 226 as the topmost curve, the power transformer (W1) magnetizing current, 218, primary switch (M1) control signal 224 and secondary switch (M2) control signal 220. Sense voltage curve 226 corresponds to the magnitude of voltage over time of $V_{REFLECTED}$ 130 as measured at $V_{SENSE}$ terminal 126, depicted in FIG. 2. W1 magnetizing current 218 corresponds to the magnitude of current over time of $I_{MAG}$ 124, as well as a corresponding magnetizing current on the secondary winding of transformer W1 114. M1 control signal 224 corresponds to the output of primary controller 102 connected to the gate of primary transistor M1, 110. M2 control signal 220 corresponds to the output of secondary controller 104 connected to the gate of SR switch M2, 112.

The power converter switching cycle starts as the time T1 230. At time T1 230 SR switch M2 112 is turned on to generate ZVS pulse 225. W1 magnetizing current starts to build up in the negative direction. Using the Vsense voltage waveform 226, primary side 130, by using pulse detector 128 and primary controller 102, may can detect the ZVS pulse 225 event.

At the time T2, SR switch M2 112 is turned off when M2 control signal 220 goes from high to low at the end of the ZVS pulse 225 event. After SR switch M2 112 turns off, the negative transformer magnetizing current (primary side) 218 recharges the Vds capacitance of primary side switch M1 110 (226).

At the time T3, the drain-source voltage, Vds, of primary side switch M1 110 is minimal, because M1 control signal 224 goes from low to high and primary side switch M1 110 is turned ON. As primary side switch M1 110 turns on, W1 magnetizing current 218 starts to increase in a positive direction.

At the time T4, transformer magnetizing current reached a desired setpoint level, M1 control signal 224 goes from high to low and primary side switch M1 110 is turned OFF. Transformer magnetizing current (secondary side) 218 is redirected to the body diode of SR switch 112, and starts to charge the output capacitor, e.g. capacitor C2 120. In some examples, reaching the desired setpoint level may be controlled by a peak current control or by a time-based PWM control, or some other type of output control technique.

At the time T5, SR switch M2 112 is switched ON to reduce the rectifier voltage drop and to improve the efficiency. This is also depicted as SR function 222 for a previous timing cycle to the timing cycle described by T1-T6.

At the time T6, SR switch M2 112 is switched OFF. Switching cycle is completed and primary side controller 102 waits for next ZVS pulse event. At the time T7, next switching cycle is started.

In the example of FIG. 3, a low to high transition on the transistor control signal, e.g. 224 or 220, turns ON a transistor. In other examples, such as in the case of a negative voltage power supply, the signals of FIG. 3, i.e., negative vs. positive and high vs. low transitions may configured in a different manner.

Figure 4:
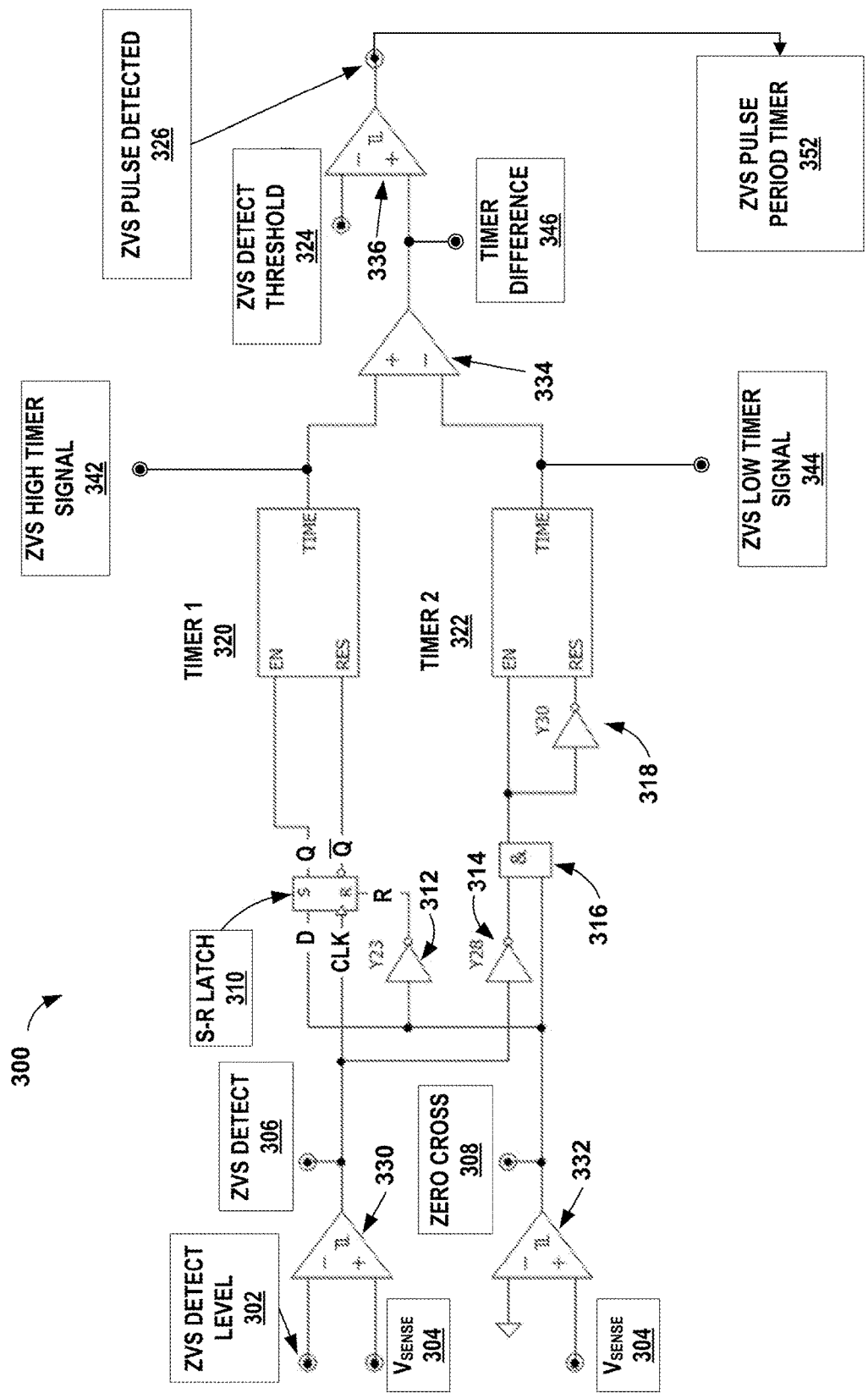
FIG. 4 is a schematic diagram illustrating one example implementation of ZVS detection and zero voltage crossing detection, according to one or more techniques of this disclosure.

FIG. 4 is a schematic diagram illustrating one example implementation of ZVS detection and zero voltage crossing detection, according to one or more techniques of this disclosure. Pulse detector 300 is one example implementation of pulse detector 128 depicted in FIG. 2. In some examples, pulse detector 300 may be incorporated into a primary side controller, such as primary controller 102 depicted in FIG. 2.

Example pulse detector 300 uses two comparators 330 and 332 for the operation. Comparator 332 is part of a zero cross detection circuit and comparator 330 detects the ZVS event as described above in relation to FIG. 3.

The zero cross detection circuit includes comparator 332, some logic gates and timer 2 322. The inverting input of comparator 332 connects to a zero reference voltage, e.g. circuit ground, and the non-inverting input of comparator 332 connects to Vsense 304. Vsense 304 corresponds to $V_{REFLECTED}$ 130 as measured at the Vsense 126 input of pulse detector 128, as depicted in FIG. 2. The output of comparator 332 is the zero cross signal 308, which connects to AND gate 316. Zero cross signal 308 connects to the Set input of SR latch 310 directly as well as the Reset input of SR latch 310 through NOT gate Y23 (312). The output of AND gate 316 connects to the Enable input of timer 2 322 as well as to the Reset input of timer 2 322 through NOT gate Y30 (318). The output of timer 2 322 is the ZVS low timer signal 344, which connects to the inverting input of an op amp configured as a subtraction circuit 334.

The ZVS detection circuit includes comparator 330, which has a non-inverting input connected to the same Vsense 304 input as the non-inverting input to comparator 304. The inverting input to comparator 330 connects to a voltage threshold for ZVS detection level 302. The output of comparator 330 is the ZVS detection signal 306. ZVS detection signal 306 indicates when the reflected voltage signal, e.g. $V_{REFLECTED}$ 130 depicted in FIG. 2, is less than a predetermined threshold voltage, i.e. ZVS detection level 302, where ZVS detection level 302 threshold is greater than zero volts.

The output of comparator 330 connects to the clock input of clocked SR latch 310 as well to AND gate 316 through NOT gate Y28 (314). The non-inverted output Q of SR latch 310 connects to the Enable input of timer 1 320. The inverted output not-Q (Q) as connects to the Reset input of timer 1 320. The output of timer 1 320 is the ZVS high timer signal 342, which connects to the non-inverting input of the op amp configured as a subtraction circuit 334.

The output of subtraction circuit 334 is timer difference signal 346. Timer difference signal 346 is ZVS low timer signal 344 (from the zero cross detection circuit) subtracted from ZVS high timer signal 342 (from the ZVS event detection circuit). Timer difference signal 346 connects to the non-inverting input of comparator 336 and is compared to a ZVS detection threshold 324 connected to the inverting input of comparator 336. ZVS detect threshold 324 should not be confused with ZVS detection level 302, though both voltage thresholds have a similar name in this disclosure. ZVS detect threshold 324 may also be considered a ZVS event detection threshold. The output of comparator 336 is the ZVS detected signal 326.

In operation, example pulse detector 300 uses the two comparators 330 and 332 for the SR switching detection operation. One of the comparators, comparator 332, detects the Vsense zero crossing, and the other comparator 330 detects when the Vsense level is above a threshold (ZVS detect level 302), which is set to be slightly below the desired reflected output voltage. The desired reflected output voltage is the voltage setpoint for the power to be output to the load, such as load 4 depicted in FIG. 1.

ZVS detect level 302 threshold at the inverting input of comparator 330 is a voltage very close to the desired reflected output voltage. Because of small variations in the output voltage, the sensed voltage (Vsense 304) may cross the threshold ZVS detect level 302 many times during a switching cycle. This may mean that the ZVS detect signal 306 may be difficult to analyze. However, the signal from the zero cross comparator 332, i.e. zero cross signal 308, may be stable in comparison to ZVS detect signal 306 and therefore zero cross signal 308 may be used to qualify ZVS detector comparator signal.

Pulse detector 300 uses the two timers, i.e. TIMER 1 320 and TIMER 2 322, for the signal qualification of ZVS detect signal 306. TIMER 1 320 starts counting on the first rising edge of the ZVS detector comparator signal, ZVS detect signal 306, and TIMER 1 320 will continue to count until the falling edge of the output of zero cross comparator 332, i.e. zero cross signal 308. In other words, TIMER 1 320 is configured to output an amount of time between each instance when the reflected voltage signal momentarily exceeds the predetermined threshold voltage, ZVS detect level 302, and when the reflected voltage signal becomes less than approximately zero volts.

TIMER 2 322 begins counting when zero cross signal 308 is high but ZVS detector comparator signal 306 is low. The difference between the two counters, i.e. the output of subtraction circuit 334 (timer difference signal 346) represents the amount of time the voltage across the SR switch was close to zero, e.g. SR switch M2 112 depicted in FIG. 2. In other words, TIMER 2 322 is configured to output an amount of time when both: (a) the output from the zero cross circuit indicates that the reflected voltage signal, Vsense 304, is greater than approximately zero volts; and the output from the ZVS detection circuit, ZVS detect 306, indicates that the reflected voltage signal, Vsense 304, exceeds the predetermined threshold voltage, ZVS detect level 302.

Subtraction circuit 334 is configured to subtract the output of TIMER 2 322 from the output of TIMER 1 320 and output a subtraction result. By comparing timer difference signal 346 with ZVS detect threshold 324 results in pulse detection circuit 300 reliably detecting the ZVS pulse (i.e. ZVS event) from SR switch on the secondary side. In other words, the primary side controller, such as primary controller 102 depicted in FIG. 2, is configured to detect the switching time of the SR switch, i.e. SR switch M2 112, based on a reflected voltage as sensed on a primary winding ($V_{SENSE}$ 126) of the power transformer. Pulse detector circuit, 300, which may be coupled to primary controller 102 is configured to compare the subtraction result, timer difference 346, to a predetermined subtraction threshold ZVS detect threshold 324. Based on timer difference 346 satisfying ZVS detect threshold 324, pulse detection circuit 300 will indicate a detection of the switching time of secondary side SR switch in the output of ZVS detected signal 326.

Figure 5:
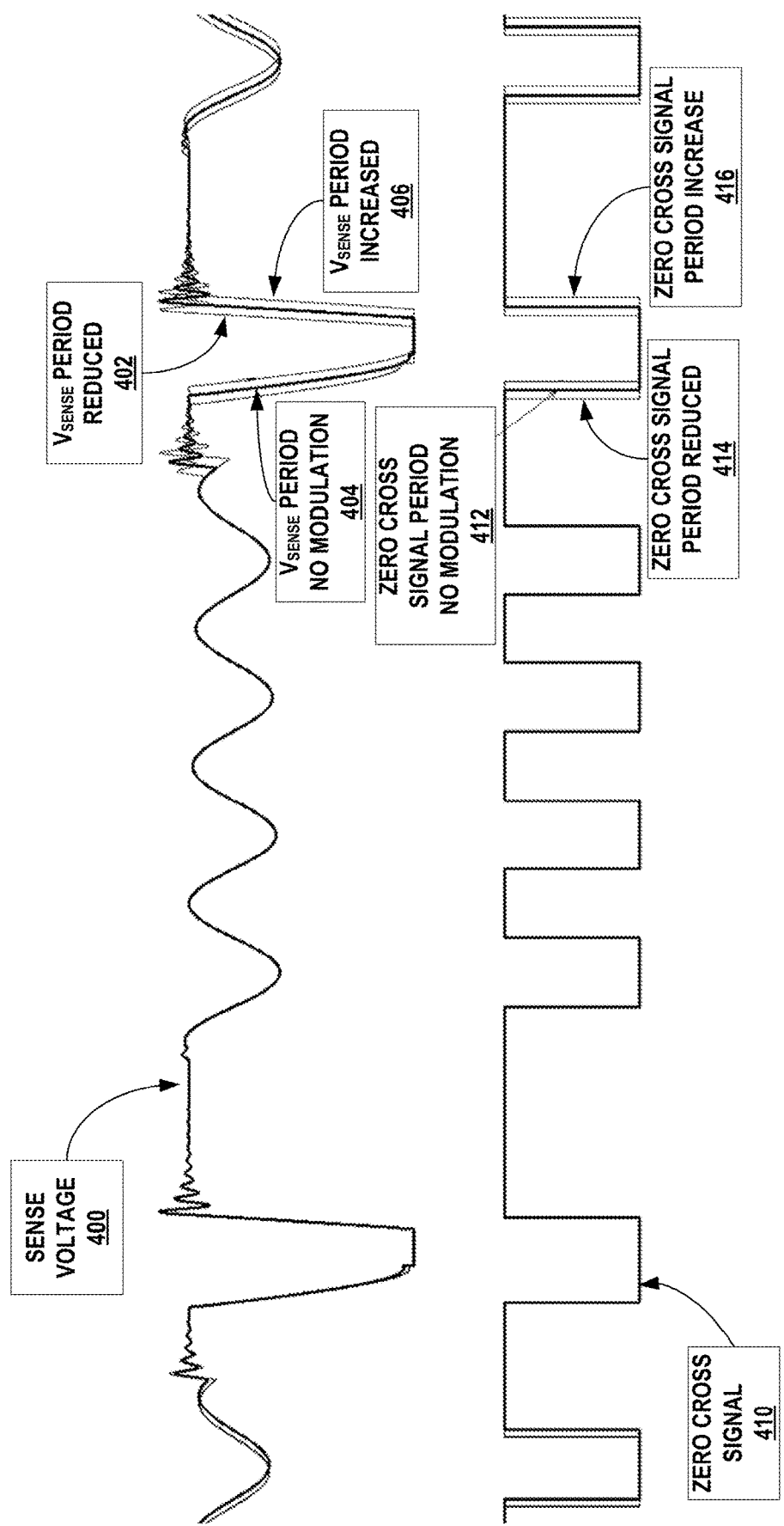
FIG. 5 is a timing diagram illustrating ZVS period modulation to communicate between the secondary side and primary side of a power converter according to one or more techniques of this disclosure.

FIG. 5 is a timing diagram illustrating ZVS period modulation to communicate between the secondary side and primary side of a power converter according to one or more techniques of this disclosure. As described above, for example in relation to FIG. 2, the secondary side controller may encode digital information by modulating a period between the switching time of the SR switch. The secondary side controller may increase the period or decrease the period. In some examples the secondary side may modulate the timing by increasing (or decreasing) the period in multiple levels. For example, the secondary side may modulate the period with four levels, such as a small increase in period and a large increase in period along with a small decrease and a large decrease in period. In some examples, the encoding scheme may include no modulation, along with the increase or decrease in period. The primary side may detect the increase in period or decrease in period, such as with a pulse detector circuit described above in relation to FIGS. 2 and 4.

The timing diagram of FIG. 5 includes sense voltage waveform 400 and zero cross signal waveform 410. Sense voltage waveform 400 may correspond to $V_{REFLECTED}$ 130 sensed on the primary winding as measured at $V_{SENSE}$ terminal 126, depicted in FIG. 2 as well as $V_{SENSE}$ 304 depicted in FIG. 4. Zero cross signal waveform 410 is an example depiction of a signal that may be measured at zero cross signal 308, i.e. the output of comparator 332 as described above in relation to FIG. 4.

With no modulation, the timing of sense voltage waveform 400 follows the curve indicated by 404, $V_{SENSE}$ period—no modulation. Similarly, zero cross signal waveform 410 follows the curve indicated by 412, zero cross signal—no modulation.

In the example in which the SR switch controller on the secondary side shortens the period between the switching time of the SR switch, the timing of the reflected voltage measured as $V_{SENSE}$ 400 changes to follow the curve indicated by 402, $V_{SENSE}$ period reduced. Similarly, zero cross signal 410, which is monitoring $V_{SENSE}$ 400, will also show a reduced period (414).

In the example in which the SR switch controller on the secondary side increases the period between the switching time of the SR switch, the timing of $V_{SENSE}$ 400 changes to follow the curve indicated by 406, $V_{SENSE}$ period increased. Similarly, zero cross signal 410, which is monitoring $V_{SENSE}$ 400, e.g. via comparator 332 described above in relation to FIG. 4, will also show an increased period (416).

Figure 6:
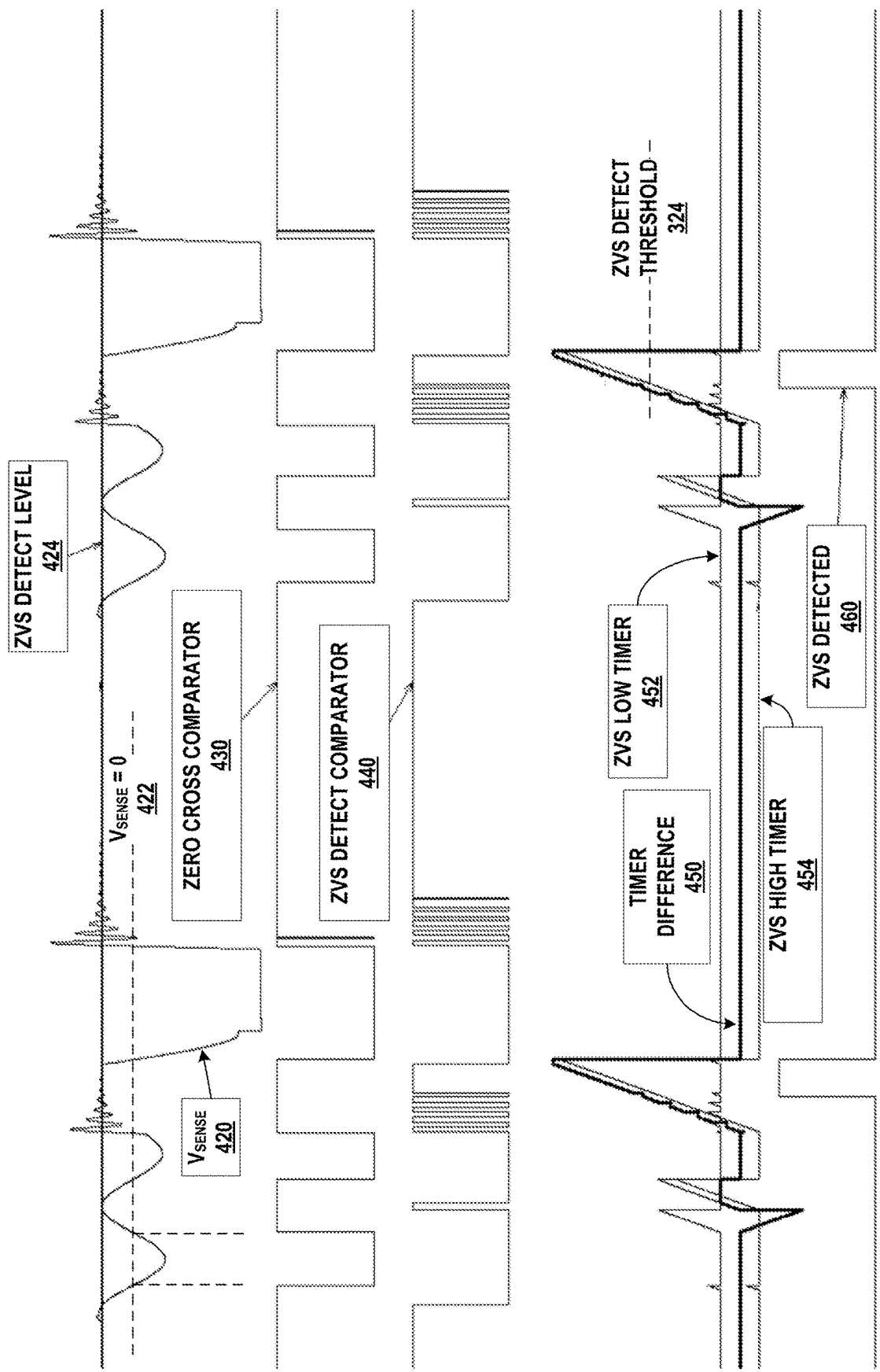
FIG. 6 is a timing diagram illustrating an example implementation of ZVS pulse detection by the example configuration of the pulse detector of FIG. 4.

FIG. 6 is a timing diagram illustrating an example implementation of ZVS pulse detection by the example configuration of the pulse detector of FIG. 4. The description of the signals in FIG. 6 will refer to components of pulse detector 300 depicted in FIG. 4.

The timing diagram of FIG. 6 compares the timing of $V_{SENSE}$ 420 waveform, the zero cross comparator 430 waveform, the ZVS detect comparator 440 waveform, the ZVS low timer 452 waveform, the ZVS high timer 454 waveform, the timer difference 450 waveform and the ZVS detected 460 waveform. The period of the switching cycle for a power converter, such as power converter described above in relation to FIG. 2, is the time between the falling edges of the ZVS detected signal 460. Because the falling edge of ZVS detected signal 460 is synchronized with the stable zero cross comparator 430 signal, ZVS detected signal 460 is also stable and may be used for high resolution detection of the SR switch timing.

$V_{SENSE}$ 420 waveform corresponds to sense voltage 400 waveform of FIG. 5, $V_{SENSE}$ 304 depicted in FIG. 3 and to $V_{SENSE}$ 126 depicted in FIG. 2. ZVS detect level 424 may be set just below the desired reflected output voltage. As described above in relation to FIG. 2, the reflected output voltage is the output voltage, e.g. $V_{OUT}$ 122, as measured on the primary side of the power transformer, e.g. transformer W1 114 depicted in FIG. 2. ZVS detect level 424 waveform corresponds to ZVS detect level 302 input to comparator 330, depicted in FIG. 4. When $V_{SENSE}$ 420 goes below ZVS detect level 424, then ZVS detect comparator 440, i.e. the output of comparator 330. goes from high to low. As described above, the signals of FIG. 6 are just one example based on the example configuration of pulse detector 300. In other examples, comparator 330, or other components, may be configured to switch from low to high, rather than high to low.

The $V_{SENSE}$=0 level 422 indicates where $V_{SENSE}$ 420 waveform crosses zero. When $V_{SENSE}$ 420 is greater than zero, zero cross comparator 430 waveform is high. When $V_{SENSE}$ 420 is less than zero, zero cross comparator 430 waveform is low.

As described above in relation to FIG. 4, ZVS high timer 454 waveform begins increasing as TIMER 1, 320, begins counting, which is when zero cross comparator 430 waveform is high but ZVS detector comparator 440 waveform is low. ZVS low timer 452 waveform begins increasing when TIMER 2, 322 begins counting, which is when zero cross comparator 430 waveform is high but ZVS detector comparator 440 waveform is low Timer difference 450 waveform is the output of subtraction circuit 334, which is configured to subtract ZVS low timer 452 waveform from ZVS high timer 454 waveform. When the value of timer difference 450 waveform satisfies the ZVS detect threshold 324 (also depicted in FIG. 4), the pulse detector circuit 300 indicates a ZVS pulse event detection, i.e. as generated by the SR switch.

In this manner, pulse detector circuit 300 may determine the timing of the period of the switching cycle for the power converter as the time between the falling edges of the ZVS detected signal 460. Communication is established from the secondary side of the power converter to the primary side by the modulating the period between the ZVS pulse time on the secondary side. The operation of pulse detector 300, according to the waveforms depicted in FIG. 6, is one example technique for the primary side to detect the ZVS pulse and decode the communication. In some examples, decoding the communication may include a third timer circuit, ZVS pulse period timer 352, to measure the length of each period and determine if a period is, for example a reduced period or an increased period.

Figure 7:
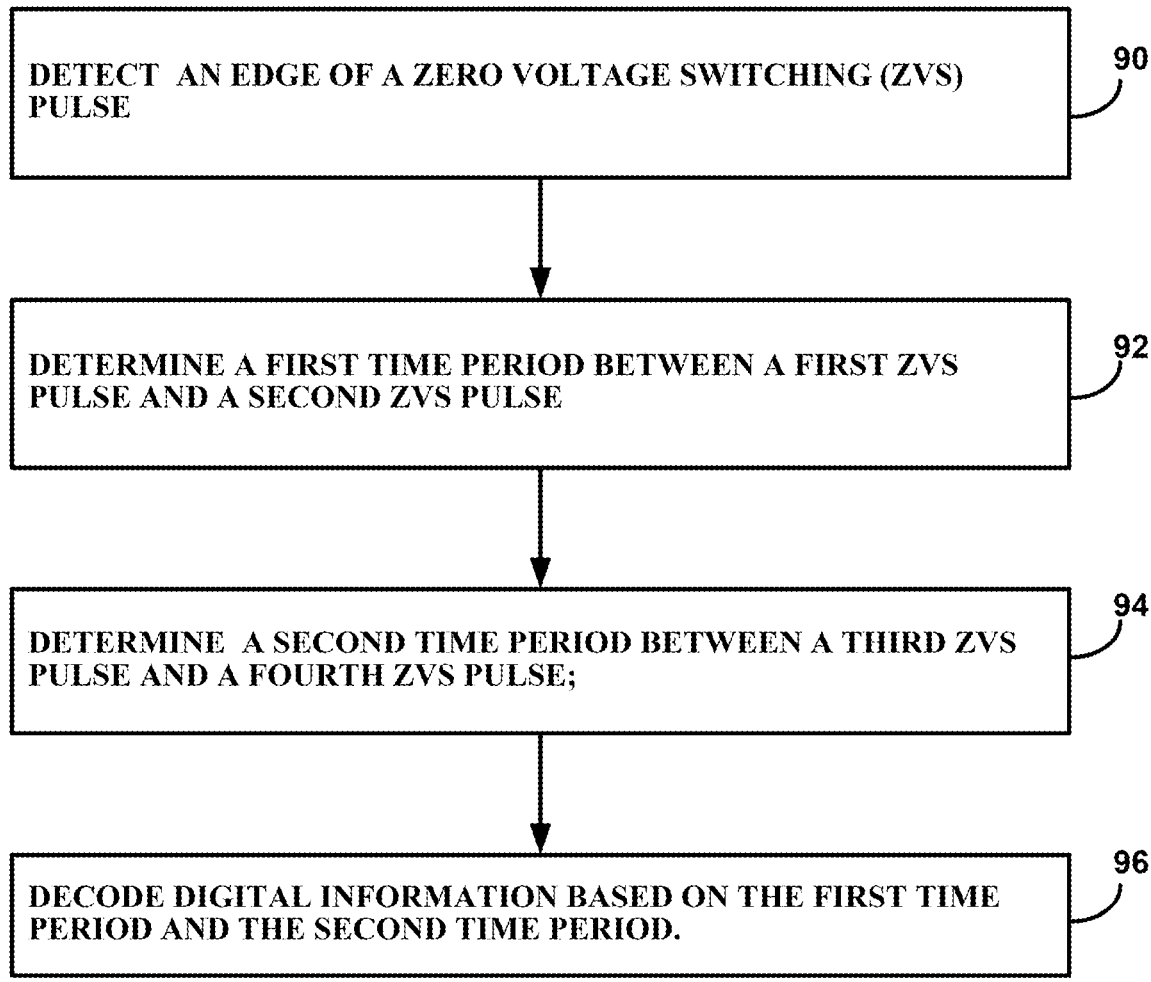
FIG. 7 is a flow diagram illustrating an example operation of a power converter configured to communicate across a power transformer, according to one or more techniques of this disclosure.

FIG. 7 is a flow diagram illustrating an example operation of a power converter configured to communicate across a power transformer, according to one or more techniques of this disclosure. The blocks of FIG. 7 will be described in terms of the timing diagrams of FIGS. 5 and 6, unless otherwise noted.

A primary controller circuit of a power converter circuit may detect a ZVS pulse generated by switching on a secondary side SR switch (90). In some examples the controller circuit may detect a leading edge of the ZVS pulse, the falling edge, or any other point in the ZVS pulse. An example primary controller circuit may include primary controller 102 of FIG. 1. As described above in relation to FIG. 1, a primary controller circuit may include a pulse detector circuit, such as pulse detector 128 of FIG. 1 or pulse detector 300 of FIG. 4. An example ZVS pulse may include ZVS pulse 225 of FIG. 3, and an example SR switch may include SR switch M2 112 of FIG. 2.

The controller circuit may determine the amount of time in a first time period between a first ZVS pulse and a second ZVS pulse (92). As described above in relation to FIG. 3, the ZVS pulse, e.g. ZVS pulse 225, indicates the start of the power converter switching cycle. One example of a time period between a first ZVS pulse and a second ZVS pulse may include the time between T1 230 and T7 242 as depicted in FIG. 3.

The controller may also determine the amount of time in a second time period between a third ZVS pulse and a fourth ZVS pulse (94). As described above in relation to FIG. 5, a secondary controller, e.g. secondary controller 104 of FIG. 2, may modulate the time between ZVS pulses by reducing the time period, increasing the time period, or no change to the time period.

The primary side controller circuit may decode digital information encoded by the secondary side controller based on the first time period and the second time period (96). As described above in relation to FIG. 1, the digital information may be encoded and decoded based on a variety of coding techniques. Some examples may include a differential coding scheme, or some other type of digital coding. In some examples, primary side controller circuit may include a timer, such as ZVS pulse period timer 352 depicted in FIG. 4, to determine the length of each period, e.g. a reduced period or an increased period. The timer may be a circuit or may be a function executed by processing circuitry that may be included in the primary side controller. A timer function executed by processing circuitry may still be considered a timer circuit because the timer is implemented by circuitry.

In one or more examples, the functions described above may be implemented in hardware, software, firmware, or any combination thereof. For example, some components of FIG. 2, such as primary controller 102 and secondary controller 104 may be implemented in hardware, software, firmware, or any combination thereof. If implemented in software, the functions may be stored on or transmitted over, as one or more instructions or code, a computer-readable medium and executed by a hardware-based processing unit.

By way of example, and not limitation, such computer-readable storage media may comprise RAM, ROM, EEPROM, magnetic disk storage, or other magnetic storage devices, flash memory, or any other medium that can be used to store desired program code in the form of instructions or data structures and that can be accessed by a computer. It should be understood, however, that computer-readable storage media and data storage media do not include connections, carrier waves, signals, or other transient media, but are instead directed to non-transient, tangible storage media.

Combinations of the above should also be included within the scope of computer-readable media.

Instructions may be executed by one or more processors, such as one or more DSPs, general purpose microprocessors, ASICs, FPGAs, or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

The techniques of this disclosure may also be described in the following examples.

Example 1

A system comprising: an isolated power converter comprising a power transformer, a secondary side controller configured to: control a synchronous rectification (SR) switch of the power converter, wherein the secondary side controller is configured to initiate zero voltage switching (ZVS) by controlling a switching time of the SR switch and encode digital information by modulating a period between the switching time of the SR switch. The system further comprises a primary side controller configured to: control a primary side switch of the power converter, detect the switching time of the SR switch, and decode the digital information based on the modulated period between the switching time of the SR switch.

Example 2

The system of example 1, wherein the primary side controller is configured to decode the digital information based on a differential decoding scheme with at least three modulation states, wherein the three modulation states are: a reduced time period, an increased time period, and no modulation.

Example 3

The system of any combination of examples 1 and 2, wherein the secondary side controller is electrically coupled to a gate of the SR switch, and wherein the primary side controller is configured to detect the switching time of the SR switch based on a reflected voltage sensed on a primary winding of the power transformer.

Example 4

The system of any combination of examples 1-3, wherein the primary side controller comprises: a zero cross detection circuit, wherein the zero cross detection circuit detects when a reflected voltage signal is greater than approximately zero volts, and a ZVS detection circuit, wherein the ZVS detection circuit detects when the reflected voltage signal is less than a predetermined threshold voltage, wherein the predetermined threshold voltage is greater than zero volts.

Example 5

The system of any combination of examples 1-4, wherein the primary side controller further comprises: a first timer circuit configured to output an amount of time between each instance when the reflected voltage signal momentarily exceeds the predetermined threshold voltage and when the reflected voltage signal becomes less than approximately zero volts, and a second timer circuit configured to output an amount of time when both: the output from the zero cross circuit indicates that the reflected voltage signal is greater than approximately zero volts and the output from the ZVS detection circuit indicates that the reflected voltage signal exceeds the predetermined threshold voltage.

Example 6

The system of any combination of examples 1-5, wherein the primary side controller further comprises a subtraction circuit, the subtraction circuit configured to: subtract the output of the second timer circuit from the output of the first timer circuit and output a subtraction result, compare the subtraction result to a predetermined subtraction threshold, and in response to the subtraction result satisfying the predetermined subtraction threshold, detect the switching time of the SR switch.

Example 7

A device comprising: a zero voltage switching (ZVS) detection circuit configured to detect a ZVS pulse, a timer circuit operatively coupled to the ZVS circuit, the timer circuit configured to: determine a first time period between a first ZVS pulse and a second ZVS pulse, and determine a second time period between a third ZVS pulse and a fourth ZVS pulse, and a decoder circuit operatively coupled to the timer circuit, the decoder circuit configured to decode digital information based on the first time period and the second time period.

Example 8

The device of example 7, wherein the device is further configured to control a primary side switch of a power converter.

Example 9

The device of any of examples 7 and 8 or any combination thereof, wherein the decoder circuit is configured to decode the digital information based on differential Manchester decoding.

Example 10

The device of any combination of examples 7-9, wherein the decoder circuit is configured to decode the digital information based on a differential decoding scheme based on three modulation states, wherein the three modulation states are: a reduced time period, an increased time period, and no modulation.

Example 11

The device of any combination of examples 7-10, wherein decoder circuit is configured to decode the digital information as: a first sequence of: no modulation, reduced time period, increased time period, no modulation to indicate a digital zero, and a second sequence of: no modulation, increased time period, reduced time period, no modulation to indicate a digital one.

Example 12

The device of any combination of examples 7-11, wherein the ZVS circuit is configured to detect a falling edge of the ZVS pulse.

Example 13

The device of any combination of examples 7-12, wherein the ZVS circuit comprises a zero cross detection circuit, wherein the zero cross detection circuit detects when a reflected voltage signal is greater than approximately zero volts; and a ZVS detection circuit, wherein the ZVS detection circuit detects when the reflected voltage signal is less than a predetermined threshold voltage, wherein the predetermined threshold voltage is greater than zero volts.

Example 14

The device of any combination of examples 7-13, wherein the timer circuit comprises a first timer circuit, and wherein the ZVS circuit further comprises a second timer circuit configured to output an amount of time between a first rising edge of an output from the ZVS detector circuit and continue to count until a falling edge of an output from the zero cross circuit.

Example 15

The device of any combination of examples 7-14, wherein the ZVS circuit further comprises a third timer circuit configured to output an amount of time when both: the output from the zero cross circuit indicates that the reflected voltage signal is greater than approximately zero volts, and the output from the ZVS detection circuit indicates that the reflected voltage signal exceeds the predetermined threshold voltage.

Example 16

The device of any combination of examples 7-15, wherein the ZVS circuit further comprises a subtraction circuit, the subtraction circuit configured to: subtract the output of the third timer circuit from the output of the second timer circuit and output a subtraction result, compare the subtraction result to a predetermined subtraction threshold, and in response to the subtraction result satisfying the predetermined subtraction threshold, output an indication of detection of the ZVS pulse.

Example 17

A method comprising: detecting, by a controller circuit, a plurality of zero voltage switching (ZVS) pulses, wherein the plurality of ZVS pulses comprise a first ZVS pulse, a second ZVS pulse, a third ZVS pulse and a fourth ZVS pulse, determining, by the controller circuit, a first time period between the first ZVS pulse and the second ZVS pulse, determining, by the controller circuit, a second time period between the third ZVS pulse and the fourth ZVS pulse and decoding, by the controller circuit, digital information based on the first time period and the second time period.

Example 18

The method of example 17, wherein the controller circuit is configured to control a primary side switch of a power converter.

Example 19

The method of any combination of examples 17-18—wherein detecting the plurality of ZVS pulses comprises: detecting, by the controller circuit, when a reflected voltage signal is greater than approximately zero volts, detecting, by the controller circuit, when the reflected voltage signal is greater than a predetermined threshold voltage, wherein the predetermined threshold voltage is greater than zero volts, determining, by the controller circuit, a first amount of time between each instance when the reflected voltage signal momentarily exceeds the predetermined threshold voltage and when the reflected voltage signal becomes less than approximately zero volts, and determining, by the controller circuit, a second amount of time when both: the reflected voltage signal is greater than approximately zero volts, and the reflected voltage signal exceeds the predetermined threshold voltage.

Example 20

The method of any combination of examples 17-19, further comprising: subtracting, by the controller circuit, the second amount of time from the first amount of time, comparing, by the controller circuit, results of the subtraction to a predetermined subtraction threshold, and in response to the subtraction result satisfying the predetermined subtraction threshold, outputting an indication of detection of the ZVS pulse.

Various examples of the disclosure have been described. These and other examples are within the scope of the following claims.

The invention claimed is:
1. A system comprising:
an isolated power converter comprising a power transformer;
a secondary side controller configured to:
control a synchronous rectification (SR) switch of the power converter, wherein the secondary side controller is configured to initiate zero voltage switching (ZVS) by controlling a switching time of the SR switch; and
encode digital information by modulating a period between the switching time of the SR switch;
a primary side controller configured to:
control a primary side switch of the power converter;
detect the switching time of the SR switch; and
decode the digital information based on the modulated period between the switching time of the SR switch.
2. The system of claim 1, wherein the primary side controller is configured to decode the digital information based on a differential decoding scheme with at least three modulation states, wherein the three modulation states are:

a reduced time period;
an increased time period; and
no modulation.

3. The system of claim 1,
wherein the secondary side controller is electrically coupled to a gate of the SR switch; and
wherein the primary side controller is configured to detect the switching time of the SR switch based on a reflected voltage sensed on a primary winding of the power transformer.

4. The system of claim 3, wherein the primary side controller comprises:
a zero cross detection circuit, wherein the zero cross detection circuit detects when a reflected voltage signal is greater than approximately zero volts; and
a ZVS detection circuit, wherein the ZVS detection circuit detects when the reflected voltage signal is less than a predetermined threshold voltage, wherein the predetermined threshold voltage is greater than zero volts.

5. The system of claim 4 wherein the primary side controller further comprises:
a first timer circuit configured to output an amount of time between each instance when the reflected voltage signal momentarily exceeds the predetermined threshold voltage and when the reflected voltage signal becomes less than approximately zero volts; and
a second timer circuit configured to output an amount of time when both:
the output from the zero cross circuit indicates that the reflected voltage signal is greater than approximately zero volts; and
the output from the ZVS detection circuit indicates that the reflected voltage signal exceeds the predetermined threshold voltage.

6. The system of claim 5 wherein the primary side controller further comprises a subtraction circuit, the subtraction circuit configured to:
subtract the output of the second timer circuit from the output of the first timer circuit and output a subtraction result;
compare the subtraction result to a predetermined subtraction threshold; and
in response to the subtraction result satisfying the predetermined subtraction threshold, detect the switching time of the SR switch.

7. A device comprising:
a zero voltage switching (ZVS) detection circuit configured to detect a ZVS pulse;
a timer circuit operatively coupled to the ZVS circuit, the timer circuit configured to:
determine a first time period between a first ZVS pulse and a second ZVS pulse; and
determine a second time period between a third ZVS pulse and a fourth ZVS pulse; and
a decoder circuit operatively coupled to the timer circuit, the decoder circuit configured to decode digital information based on the first time period and the second time period.

8. The device of claim 7, wherein the device is further configured to control a primary side switch of a power converter.

9. The device of claim 7, wherein the decoder circuit is configured to decode the digital information based on differential Manchester decoding.

10. The device of claim 7, wherein the decoder circuit is configured to decode the digital information based on a differential decoding scheme based on three modulation states, wherein the three modulation states are:
a reduced time period;
an increased time period; and
no modulation.

11. The device of claim 10, wherein decoder circuit is configured to decode the digital information as:
a first sequence of: no modulation, reduced time period, increased time period, no modulation to indicate a digital zero, and
a second sequence of: no modulation, increased time period, reduced time period, no modulation to indicate a digital one.

12. The device of claim 7, wherein the ZVS circuit is configured to detect a falling edge of the ZVS pulse.

13. The device of claim 7, wherein the ZVS circuit comprises
a zero cross detection circuit, wherein the zero cross detection circuit detects when a reflected voltage signal is greater than approximately zero volts; and
a ZVS detection circuit, wherein the ZVS detection circuit detects when the reflected voltage signal is less than a predetermined threshold voltage, wherein the predetermined threshold voltage is greater than zero volts.

14. The device of claim 13, wherein the timer circuit comprises a first timer circuit, and wherein the ZVS circuit further comprises a second timer circuit configured to output an amount of time between a first rising edge of an output from the ZVS detector circuit and continue to count until a falling edge of an output from the zero cross circuit.

15. The device of claim 14, wherein the ZVS circuit further comprises a third timer circuit configured to output an amount of time when both:
the output from the zero cross circuit indicates that the reflected voltage signal is greater than approximately zero volts; and
the output from the ZVS detection circuit indicates that the reflected voltage signal exceeds the predetermined threshold voltage.

16. The device of claim 15, wherein the ZVS circuit further comprises a subtraction circuit, the subtraction circuit configured to:
subtract the output of the third timer circuit from the output of the second timer circuit and output a subtraction result;
compare the subtraction result to a predetermined subtraction threshold; and
in response to the subtraction result satisfying the predetermined subtraction threshold, output an indication of detection of the ZVS pulse.

17. A method comprising:
detecting, by a controller circuit, a plurality of zero voltage switching (ZVS) pulses, wherein the plurality of ZVS pulses comprise a first ZVS pulse, a second ZVS pulse, a third ZVS pulse and a fourth ZVS pulse;
determining, by the controller circuit, a first time period between the first ZVS pulse and the second ZVS pulse;
determining, by the controller circuit, a second time period between the third ZVS pulse and the fourth ZVS pulse; and
decoding, by the controller circuit, digital information based on the first time period and the second time period.

18. The method of claim 17, wherein the controller circuit is configured to control a primary side switch of a power converter.

19. The method of claim 17, wherein detecting the plurality of ZVS pulses comprises:
  detecting, by the controller circuit, when a reflected voltage signal is greater than approximately zero volts;
  detecting, by the controller circuit, when the reflected voltage signal is greater than a predetermined threshold voltage, wherein the predetermined threshold voltage is greater than zero volts;
  determining, by the controller circuit, a first amount of time between each instance when the reflected voltage signal momentarily exceeds the predetermined threshold voltage and when the reflected voltage signal becomes less than approximately zero volts; and
determining, by the controller circuit, a second amount of time when both:
  the reflected voltage signal is greater than approximately zero volts; and
  the reflected voltage signal exceeds the predetermined threshold voltage.

20. The method of claim 19, further comprising:
  subtracting, by the controller circuit, the second amount of time from the first amount of time;
  comparing, by the controller circuit, results of the subtraction to a predetermined subtraction threshold; and
  in response to the results of the subtraction satisfying the predetermined subtraction threshold, outputting an indication of detection of the ZVS pulse.

* * * * *